United States Patent [19]
Oguchi et al.

[11] 3,969,641
[45] July 13, 1976

[54] QUARTZ CRYSTAL VIBRATOR

[75] Inventors: Kikuo Oguchi, Shimosuwa; Akio Shimoi; Toshiaki Ogata, both of Suwa, all of Japan

[73] Assignee: Kabushiki Kaisha Suwa Seikosha, Tokyo, Japan

[22] Filed: Apr. 16, 1974

[21] Appl. No.: 461,462

[30] Foreign Application Priority Data
Apr. 16, 1973 Japan............................ 48-42927
May 7, 1973 Japan............................ 48-50440
May 30, 1973 Japan............................ 48-60493

[52] U.S. Cl................................. 310/9.5; 310/8.2; 310/9.4; 310/9.6; 310/9.7; 310/9.8
[51] Int. Cl.²........................................ H01L 41/18
[58] Field of Search........... 310/8.2, 9.5, 9.6, 9.7, 310/9.8; 58/23 TF

[56] References Cited
UNITED STATES PATENTS

| | | | |
|---|---|---|---|
| 3,488,530 | 1/1970 | Staudte | 310/9.1 |
| 3,683,213 | 8/1972 | Staudte | 310/8.2 X |
| 3,697,766 | 10/1972 | Ganter et al. | 310/8.2 |
| 3,766,616 | 10/1973 | Staudte | 310/8.2 X |

*Primary Examiner*—Mark O. Budd
*Attorney, Agent, or Firm*—Blum, Moscovitz, Friedman & Kaplan

[57] ABSTRACT

A flexural mode quartz crystal vibrator formed from a quartz crystal plate having first and second opposed substantially planar surfaces, with a plurality of electrodes on at least one side thereof, is provided. The vibrator is characterized by the placement of electrodes on at least one of the opposed surfaces of the quartz crystal plate, the placement of the electrodes providing a vibrator having a thickness of 0.5 mm or less.

26 Claims, 28 Drawing Figures

FIG. IIa  FIG. IIb

QUARTZ CRYSTAL VIBRATOR

BACKGROUND OF THE INVENTION

This invention is directed to a flexural mode quartz crystal vibrator and in particular to the placement of electrodes on a quartz crystal plate to improve the utility of a quartz crystal vibrator by reducing the thickness thereof.

Recently, quartz crystal watches have been developed that are practically priced to compete with mechanical watches and the development, manufacture and sales thereof have rapidly accelerated. Such quartz crystal timepieces utilize quartz crystal vibrators to provide a high frequency time standard signal. The quartz crystal vibrators are operated in the flexural mode of vibration, namely, the free-free-bar type or the tuning fork type. Both type flexural mode vibrators utilize a plus five degree X-cut or an NT-cut quartz crystal plate formed by conventional mechanical processes such as diamond wheel cutting, supersonic cutting or the like.

A recent development in manufacturing quartz crystal plates is the chemical processing of a quartz crystal by photo-etching the electrodes onto the quartz crystal plate. Such photo-etching has heretofore been only utilized with NT-cut quartz crystal, such flexural mode vibrators formed with a chemically processed NT-cut quartz crystal plate having been disclosed in Japanese Patent publication No. 48-3575. X-cut quartz crystal vibrators facilitate the connection thereof into an oscillator circuit due to their low dynamic impedance. Further, they permit precise adjustment of the operating point of an oscillator circuit due to their stabilized flexion-point temperature characteristics at room temperature. However, such mechanically cut quartz crystal plates have heretofore been formed of a thickened crystal plate. The thickness of the crystal plate does not recommend such X-cut quartz crystal plates to an electronic timepiece wherein minimal space requirements are essential. Similarly, although NT-cut flexural quartz crystal vibrators have included small-sized quartz crystal plates which are much thinner than X-cut plates, the dynamic impedance of the NT-cut plates is extremely high and the temperature-resonance frequency characteristic at room temperature is volatile, thereby rendering same less than completely satisfactory.

SUMMARY OF THE INVENTION

Generally speaking, in accordance with the invention, a flexural mode quartz crystal vibrator comprising a quartz crystal plate having a first and second opposed substantially planar surface is provided. A pluraltiy of electrodes is disposed on at least one surface of the quartz crystal plate to thereby provide a flexural mode vibrator. The use of the electrodes in a particular configuration provides a quartz crystal vibrator having a thickness no greater than 0.5 mm.

Accordingly, it is an object of this invention to provide an improved flexural mode quartz crystal vibrator having minimal thickness.

It is another object of this invention to provide an improved flexural mode quartz crystal vibrator having an X-cut quartz crystal plate.

It is still another object of this invention to provide an improved quartz crystal vibrator having a minimal thickness yet admitting of a highly efficient operation.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

DETAILED DESCRIPTION OF THE PREFERRED EMBODIMENTS

Figure 1:
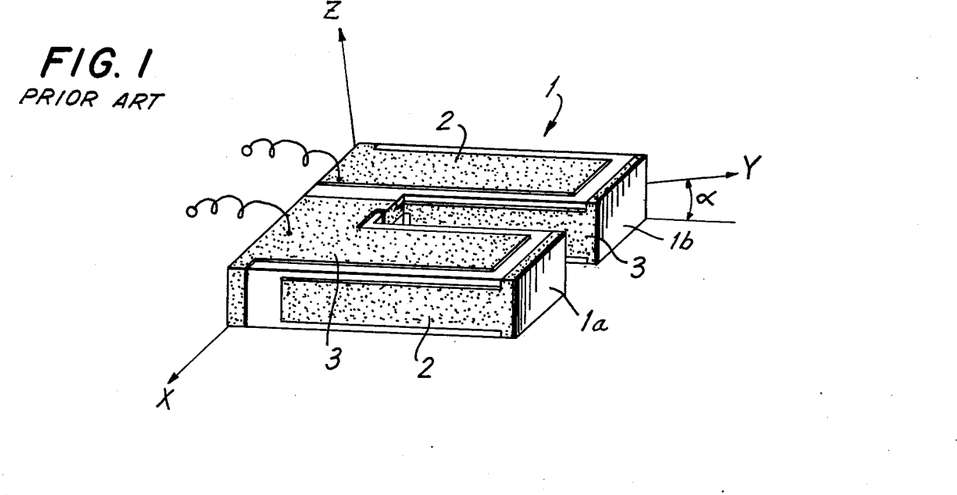
FIG. 1 is a perspective view of a tuning fork quartz crystal vibrator constructed in accordance with the prior art.
Figure 2:
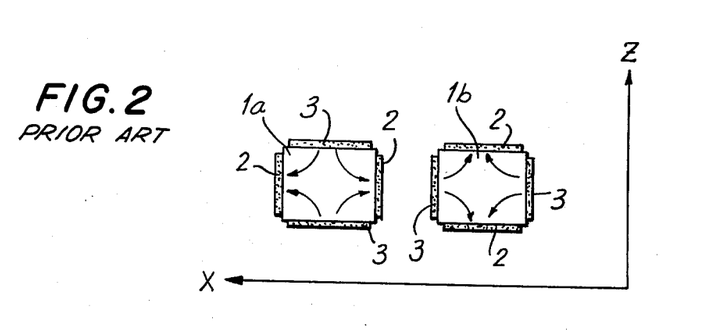
FIG. 2 is a sectional view of the quartz crystal vibrator depicted in FIG. 1.

Reference is now made to FIGS. 1 and 2, wherein a prior art +5° X-cut tuning fork flexural-mode quartz crystal vibrator 1 formed by well-known mechanical processes is depicted. The tuning fork vibrator 1, as well as the other representations included in FIGS. 3 through 21 are illustrated with reference to the X, Y and Z axes, which represent the electrical, mechanical and optical axes of the quartz crystal plate, respectively. Quartz crystal vibrator 1 is formed from an X-cut plate which is obtained by rotating a Z-cut plate around the X axis by an angle $\alpha$, which angle $\alpha$ is in the range of 0° to 10°, the angle most often selected equalling 5°. A first plurality of electrodes 2 are disposed on the sides of a first tine 1a and are disposed on the top and bottom surfaces of a second tine 1b. Assuming that alternating positive and negative pulses are applied to electrodes 2 and 3, the electric fields depicted by the curved arrows in FIG. 2 are generated within the quartz crystal tines. The transverse components of the electric fields, namely, the components in the direction of the electrical X axis, effect a stress in the quartz crystal. In accordance with the electrode configuration depicted in FIG. 2, the X-axis components of the electric fields have a different direction in each tine. Accordingly, when an expansive stress is effected in one tine, a contractive stress is caused in the other tine. Thus, a symmetrical flexural vibration is effected in the quartz crystal vibrator in the plane defined by the top and bottom surfaces when the alternating current is applied to the electrodes. Such X-cut quartz crystal vibrators have become popular in electronic timepiece oscillator circuits because the dynamic impedance thereof is low, thereby rendering same easily connected to an oscillator circuit. Also X-cut quartz crystal vibrators provide highly precise time standard signals because the temperature-resonance frequency at room temperatures yields a stabilized flexion point. The efficiency of the X-cut crystal vibrator is caused by the transverse stress components generated by electrodes disposed on the sides of the tines. The thickness of such X-cut quartz crystal vibrators is increased by the placement of electrodes on the sides of the quartz crystal plate. Accordingly, it is impossible to provide a quartz crystal vibrator in a flexural mode having the thickness of 0.5 mm or less when electrodes are disposed on the sides thereof. Moreover, because the cutting of a quartz crystal vibrator into the shape of a tuning fork is achieved by a mechanical processing method such as a diamond wheel cutter, supersonic cutter or the like, reduction in the size thereof encounters further difficulties.

Figure 3:
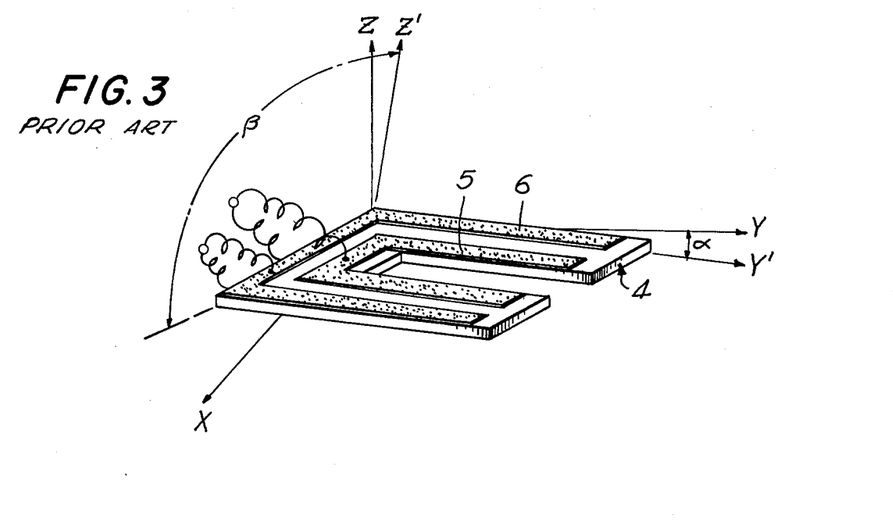
FIG. 3 is an NT-cut quartz crystal vibrator constructed in accordance with the prior art.
Figure 4:
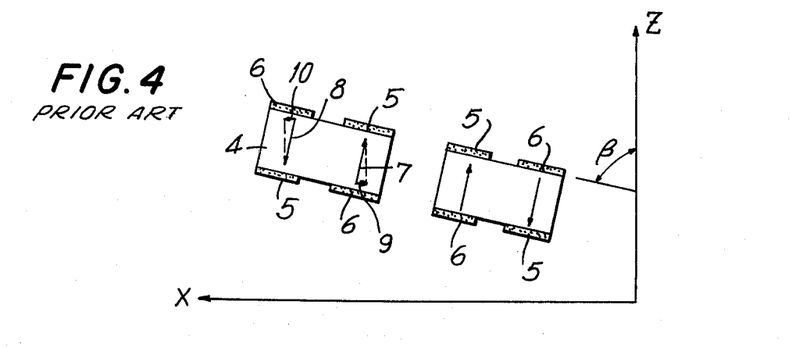
FIG. 4 is a sectional view of the vibrator depicted in FIG. 3.

Referring now to FIGS. 3 and 4, an NT-cut tuning fork flexural-mode quartz crystal vibrator 4 manufactured by a conventional chemical process is depicted. The thickness of the tuning fork as illustrated in FIG. 4 is exaggerated in order to more clearly explain same, it being noted that the actual thickness thereof is very thin by comparison to the width of each tine. In order to simplify the drawing, the angle $\alpha$ is set for 0° about the X axis, it being noted that $\alpha$ is in the range of 0°–10°. The tuning fork flexural-mode quartz crystal vibrator 4 has an electrode 5 on the top surface on the inner peripheral side of the tines and an outer peripheral electrode 6 disposed on the outer periphery of the tines. However, on the bottom surface of the quartz crystal plate the electrodes 5 and 6 are reversed, the electrode 5 being formed on the outer periphery thereof, while the electrode 6 is formed on the inner periphery thereof. The vibrator is formed from a quartz crystal plate which is obtained by rotating an X-cut plate around X - axis by an angle $\alpha$ and further rotating same by an angle $\beta$ around the Y' axis, which as hereinabove noted, is found by rotating the Y axis through a rotation $\alpha$. The angle $\alpha$ is predetermined to be in the range of 0° to 10°, and the angle $\beta$ is predetermined to be 50° to 70° or −50° to −70°. As is appreciated by a viewing of the electrodes illustrated in FIG. 4, since such a vibrator does not require side electrodes, the quartz crystal plate can be formed with a minimal thickness. Accordingly, such a tuning fork vibrator can be formed by a chemical processing method allowing the electrodes to be photo-etched thereon, thereby resulting in a small-sized, extremely thin, flexural mode vibrator, Nevertheless, when the electrodes 5 and 6 have applied thereto positive and negative pulses, respectively, an alternating-current signal, the electric fields generated in the tines produce components 7 and 8 across the electrodes and transverse components 9 and 10 in the direction of the electrical axis X, causing the necessary stress to generate a symmetrical flexural vibration in the tuning fork in the manner discussed above. Nevertheless, because the net transverse field components 9 and 10 are small in comparison to the field components 7 and 8 across the electrodes, the stress component along the X-axis is obtained by multiplying the strength of the fields between the electrodes by cosine $\beta$, thereby significantly increasing the tuning fork vibrator's dynamic impedance. The increase in dynamic impedance is inversely proportional to cosine $^2\beta$, as has been determined by experimental calculations. Thus, when $\beta$ is 70° for an X-cut plate, the field across the electrodes is 8.5 times stronger than the transverse stress fields. Similarly when $\beta$ is 75°, the field across the electrodes is 15 times greater, and when $\beta$ equals 90°, the field across the electrodes is infinite. Moreover, the temperature-resonance frequency characteristic substantially increases in accordance with the corresponding increase in the angle $\beta$, thereby limiting the flexion-point temperature to a rather low value because the angle $\beta$ is generally predetermined to be 70° or less in order to keep the dynamic impedance as low as possible. Thus, an NT-cut flexural-mode quartz crystal vibrator as illustrated in FIGS. 3 and 4 is not suitable for use in electronic timepieces because the dynamic impedance thereof is too high and the flexion-point temperature at which the temperature-resonance frequency is determined is too low, thus making it impossible to utilize the reduced size and mass-production advantages which inure to such a photo-etching process.

Figure 5:
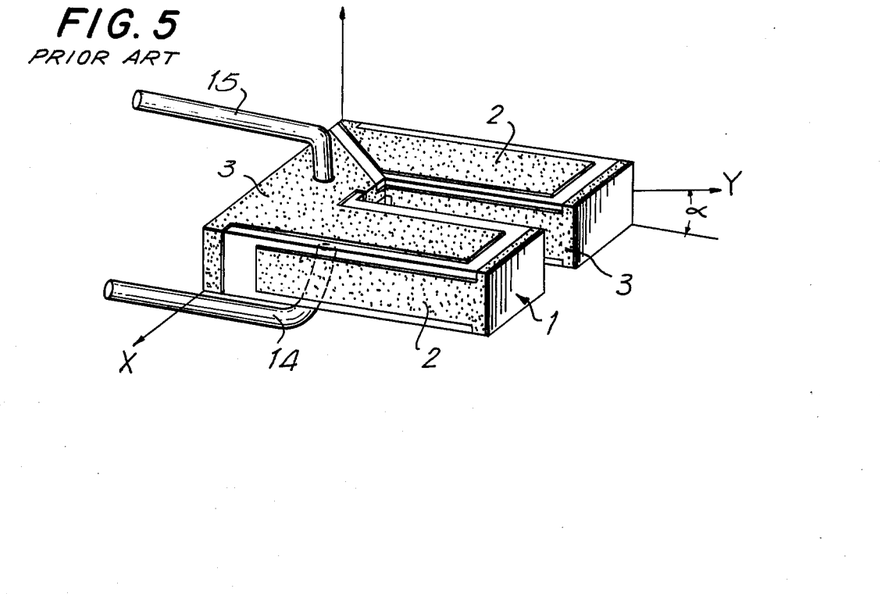
FIG. 5 is a perspective view of the mounting of the quartz crystal vibrator depicted in FIG. 1.
Figure 6:
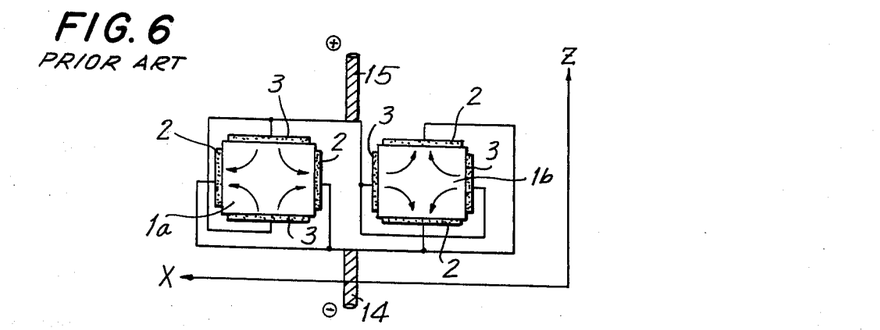
FIG. 6 is a sectional view of the vibrator depicted in FIG. 5.

Reference is also made to FIGS. 5 and 6, wherein the X-cut quartz crystal vibrator 1 as depicted in FIG. 1 is supported by spring conductors 14 and 15, like numerals being utilized to denote like elements. The supporting wires 14 and 15 are affixed to the electrodes by soldering or the like to physically support the vibrator as well as to electrically couple electrodes 2 and 3 to the voltage source supplying alternating current thereto. Moreover, because the vibrator is supported by the lead wires, which must be soldered to the narrow portions of the electrodes, the operation of such a vibrator is less than completely satisfactory.

Figure 7:
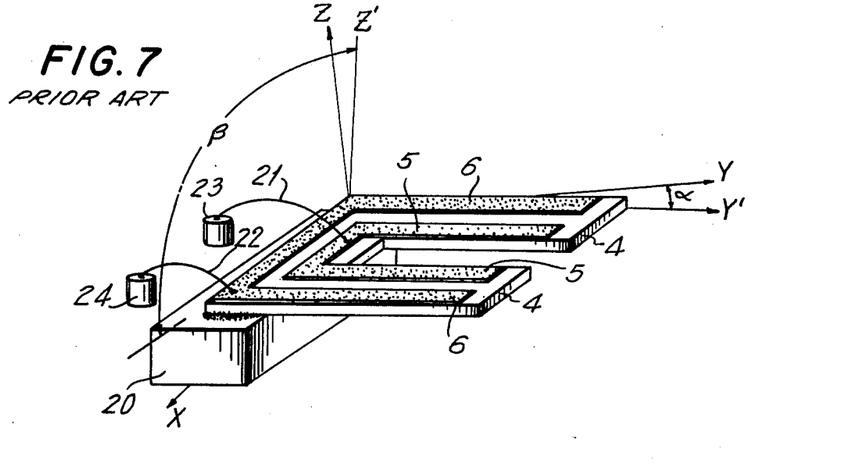
FIG. 7 is a perspective view of the mounting of a quartz crystal vibrator constructed in accordance with the prior art.
Figure 8:
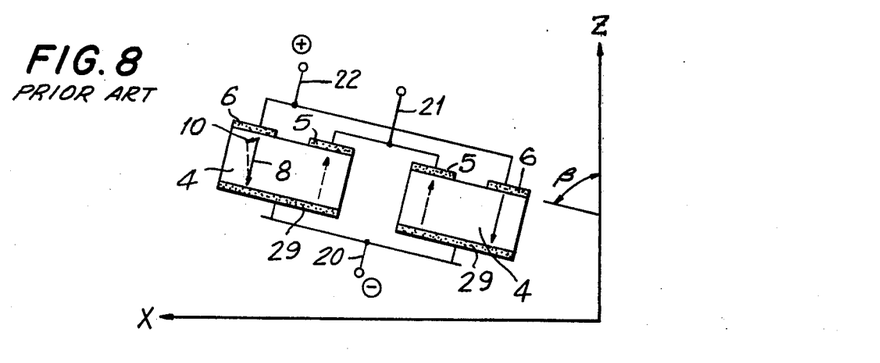
FIG. 8 is a sectional view of the quartz crystal vibrator depicted in FIG. 7.

Also, reference is made to FIGS. 7 and 8, wherein the NT-cut tuning fork flexural-mode quartz crystal vibrator 4 illustrated in FIGS. 3 and 4 is supported by an electrode 29 on the lower surface thereof in contact with a support 20, like reference numerals denoting like elements. It is noted that very thin vibrators produced by chemical processing cannot be supported by lead wires of the type depicted in FIG. 5. However, the manner in which the vibrator is supported on the nonvibratory back surface of a tuning fork vibrator by providing a single back electrode 29 and affixing same to a conductive supporter 10 with an alloy having a low melting point, such as solder, or a conductive adhesive agent is particularly suited for mounting a thin vibrator. Accordingly, the entire size of the vibrator can be reduced and the operability thereof improved by utilizing such a support in comparison with the use of supporting lead wires. It is noted that the remote leads 23 and 24 are connected to the electrodes 5 and 6, respectively, by connecting leads 21 and 22 by well-known techniques. The single electrode on the bottom surface of the tuning fork vibrator is electrically coupled to the outside by conductive supporter 20, thereby providing a three-terminal connection to the quartz crystal vibrator.

From the foregoing it is appreciated that a conventional +5° X-cut quartz crystal vibrator has the advantage that its dynamic impedance is low and the flexion-point temperature of its temperature-resonance frequency characteristic is high and the disadvantage that size reduction is impossible due to the side electrodes and the inability to chemically process same. On the other hand, the conventional NT-cut vibrator, although providing for a thin chemically processed vibrator, is disadvantageous in view of its high dynamic impedance and low flexion-point temperature. In the prior art, +5° X-cut and NT-cut quartz crystal plate vibrators have been regarded as entirely different types of flexural mode vibrators because the method of applying electric fields thereto is so different. Nevertheless, a comparison of the cutting angles of both types indicates that the cutting methods thereof are almost equivalent. Namely, the difference in the angle β is small, the angle β of +5° X-cut and NT-cut is no more than 90°, and 50° to 70° or −50° to −70°, respectively. Although they have similar cutting angles, the two types of vibrators are considered separate due to their different driving methods. By combining features of both, the vibrators in accordance with the invention described below achieves the advantages of both types of vibrators.

Figure 9:
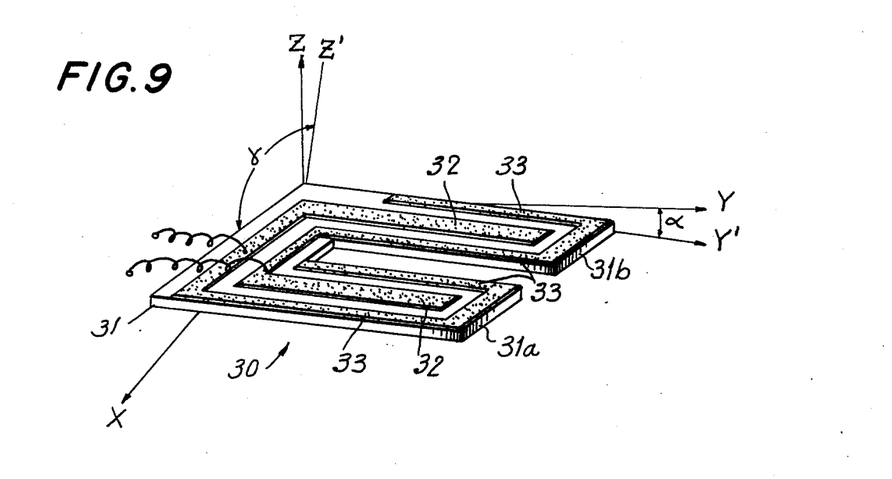
FIG. 9 is a perspective view of a flexural quartz crystal vibrator constructed in accordance with the instant invention.
Figure 10:
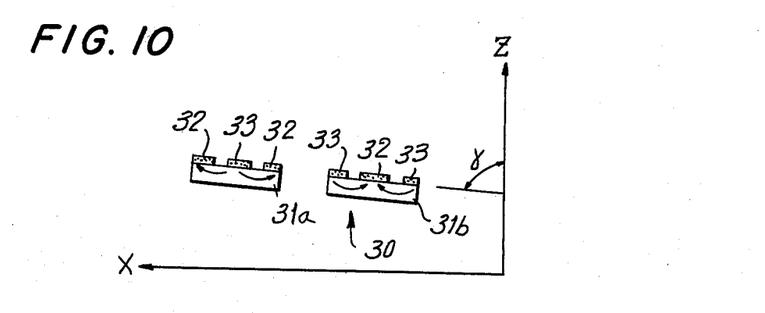
FIG. 10 is a sectional view of the quartz crystal vibrator depicted in FIG. 9.

Reference is now made to FIG. 9, wherein a tuning fork flexural-mode quartz crystal vibrator 30 is constructed in accordance with the instant invention, and to FIG. 10, wherein the electrode configuration thereof is illustrated in cross-section. As is illustrated in FIG. 10, the angle α is set at 0° in order to simplify the illustration. Accordingly, the quartz crystal plate 31 has electrodes 32 and 33 disposed on a single surface. The plate is formed by rotating an X-cut plate around the X axis by an angle α and then further rotating same by an angle γ around the Y′ axis in the same manner as discussed above. The angle α is predetermined to equal 0° to 10°, and the angle γ is predetermined to equal 70° to 90° or −70° to −90° to thereby provide an advantageous temperature characteristic even though the angle γ would be the same as that for the NT-cut.

Electrodes 32 and 33 are disposed on only one surface of the quartz crystal vibrator 30 and are provided in a particular configuration so that electrode 33 peripherally disposed around tine 31a extends onto tine 31b intermediate the other electrode 32, which electrode 32 is peripherally disposed on the other tine 31b and extends intermediate electrode 33 on tine 31a. In operation, when electrodes 32 and 33 have applied thereto positive and negative voltages, respectively, by an alternating current signal, the electric fields illustrated by the curved arrows in FIG. 10 are generated. As the generated stress has reverse directions at the inner and outer sides of the tines, a symmetrical flexural vibration is effected in the tuning fork vibrator. Further, the transverse electric fields in the X-axis cirection are considerably larger than those generated in the prior art embodiments. Nonetheless the dynamic impedance of the quartz crystal vibrator when compared to the prior art NT-cut is considerably lower. More significantly, by utilizing such a configuration, no electrodes are disposed on the sides of the vibrator, thereby allowing the quartz crystal plate to have a thickness of 0.5 mm or less. Finally, a photo-etching technique can be utilized once the thin plate is cut into a tuning fork shape to form the electrodes, further reducing the size of the vibrator.

Figures 11A, 11B:
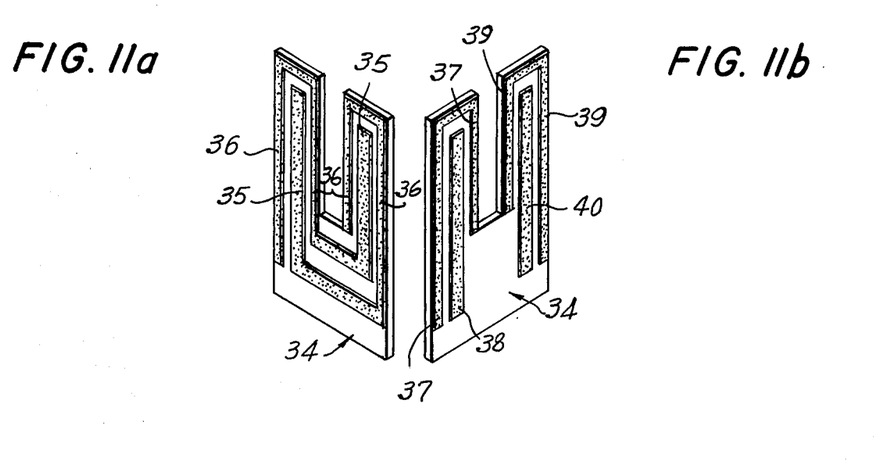
FIGS. 11a and 11b are perspective views of the front and back surfaces, respectively, of a flexural mode quartz crystal vibrator constructed in accordance with the instant invention.
Figure 12:
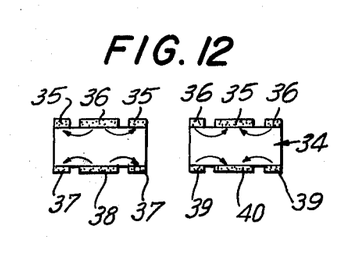
FIG. 12 is a sectional view of the quartz crystal vibrator depicted in FIGS. 11a and 11b.

Referring now to FIGS. 11a and 11b, there is illustrated therein another embodiment of the instant invention wherein an electrode configuration is disposed on both the front and back surfaces of a quartz crystal vibrator in accordance with the instant invention. The electrodes are disposed on both sides of tuning fork quartz crystal vibrator 34, which is cut in the same manner as the plate 31 of the quartz crystal vibrator depicted in FIG. 9. Electrodes 37, 38, 39 and 40 are disposed on the bottom surface of the crystal plate and form two pairs of electrodes. By coupling electrode 35 to electrodes 37 and 40, and further coupling electrode 36 to electrodes 38 and 39, and then applying an a.c. voltage thereto, a transverse electric field similar to the component depicted in FIG. 10, is generated in each tine, and symmetrical flexural vibration of the tuning fork vibrator is achieved. Moreover, the component of the stress field in the X-axis direction is even larger than was effected for the conductors being disposed on only a single surface of the vibrator, thereby further lowering the dynamic impedance of the vibrator. It is noted that electrodes 37 and 40, and 38 and 39, may be respectively connected and each pair of electrodes on the bottom surface further connected with the electrodes on the top surface to form a two-terminal quartz crystal vibrator. Also, a filter having a driving electrode and a pair of detecting electrodes can be formed by coupling a pair of front electrodes 35 and 36 to provide a driving electrode and to couple the back electrodes 37 and 40, and 38 and 39, respectively, to form the detecting electrodes. Also, a double-output filter can be formed by utilizing the electrodes on the front surface as a pair of driving electrodes, the back electrodes 37 and 38 as one pair of detecting electrodes, and electrodes 39 and 40 as the other pair of detecting electrodes.

Accordingly, a chemical forming process such as photo-etching can be utilized after the quartz crystal thin plate is cut into a tuning fork shape to form the electrodes, the electrode configuration causing the vibrator to admit of a more efficient operation. Accordingly, a chemical processing method wherein chrome is deposited on both surfaces of a thin quartz crystal plate and then a gold layer is further deposited on the chrome layer is utilized to deposit the electrode on a quartz crystal plate. The chrome reinforces the connection between the quartz crystal and gold. Then a photo resist is applied to both surfaces, which surfaces are then exposed to light through a photo mask so that the photo resist maintains the plate thereon in the shape of a vibrator. When the plate is steeped in etching liquid gold and then etching liquid chrome, the photo resist serves as an etching mask to leave the gold and chrome with the same external shape as the vibrator. Thereafter, the plate is steeped in a solution of fluohydric acid to form the quartz crystal into the vibrator's external shape with the gold and chrome serving as an etching mask. The vibrator is then completed by shaping the electrodes in the same manner as was utilized for the etching mask of the external shape of the vibrator. When a chemical processing method utilizing a photo-etching technique is applied to a conventional 5° X-cut flexural mode quartz crystal vibrator, the vibrator cannot be used because it is necessary to deposit a metallic substance on the side surface of the quartz crystal plate after it is shaped and finished. In contradistinction thereto, by utilizing the process hereinabove discussed, with electrodes on only one surface or possibly on a second opposed surface, the electrodes are not needed on the side surfaces, and a very thin quartz crystal plate is thereby realized.

Figure 13A:
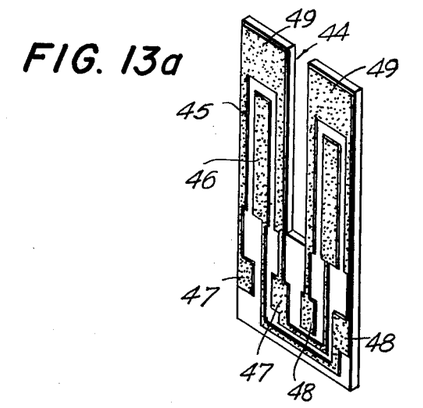
FIGS. 13a and 13b, FIGS. 14a and 14b and 15a and 15b are perspective views of the front and back surfaces of three embodiments of flexural mode quartz crystal vibrators constructed in accordance with the instant invention.

In accordance with the above noted forming process, two further embodiments are depicted in FIGS. 13a and 13b, and 14a and 14b, respectively. In FIG. 13a a top surface of a tuning fork flexural-mode quartz crystal vibrator 44 having electrodes 45 and 46 disposed on the top surface thereof is depicted. The electrodes 45 and 46 are coupled together through connecting regions 47 and 48. The portion 49 at the end of each tine is utilized to control the resonant frequency of the tuning fork vibrator by evaporating the metal to adjust the resonant frequency thereof. Such conventional techniques as laser irradiation are utilized to evaporate the metal from the portion 49 of the tines. It is further noted that the two connecting regions 47 and 48 are provided for each electrode to lessen the possibility that the vibrator can become inoperative due to a cutting or breaking of an electrode during photo-etching caused by a mishap such as the scratching of the quartz crystal surface.

Figure 13B:
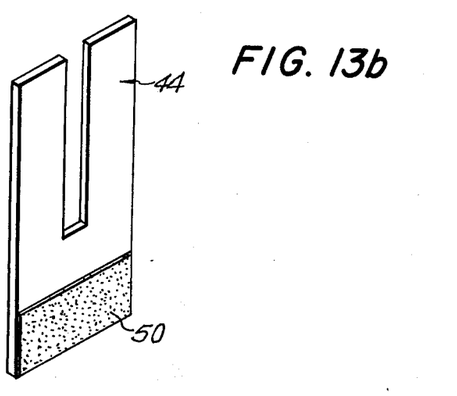

A metallic film 50 is deposited on the bottom surface of the tuning fork to allow the nonvibratory base portion thereof to be secured to a block holder. By utilizing such a block holder, the securing metallic film 50 can be formed at the same time that the electrodes are photo-etched on the top surface of the cut crystal plate. Because the metallic securing film 50 is disposed on the nonvibratory base portion of the tuning fork, it does not affect the electric field applied to the vibrator, even though it causes an increase in the inter-electrode capacitance of the vibrator.

Figure 14A:
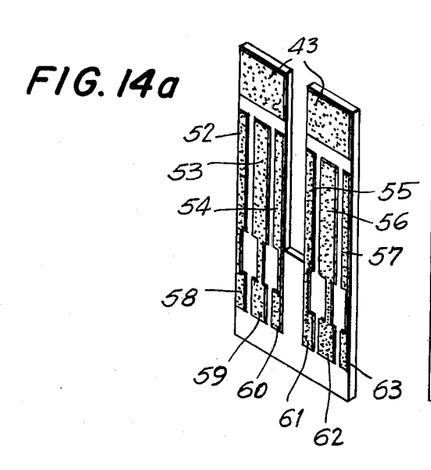
Figure 14B:
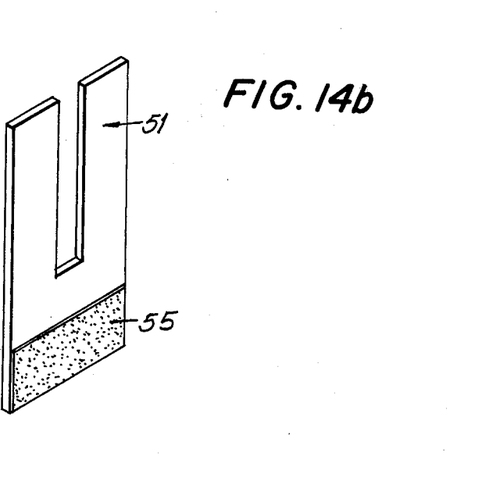

Similarly, the quartz crystal vibrator 51 illustrated in FIG. 14b includes a metallic film securing portion 55 for securing the tuning fork vibrator in the same manner as the vibrator illustrated in FIG. 13b. The top or front face of the vibrator 51 includes electrodes 52–57, each being connected to a respective connecting region 58–63. Although the electrodes on the vibrator are constructed in a two-terminal configuration in FIG. 13, it is possible to shape the electrodes in a three-terminal configuration or a multi-output filter arrangement as illustrated in FIG. 14. As noted above, a three-terminal quartz crystal vibrator can be constructed by coupling two electrode terminals 59 and 62 to ground and by connecting the lead wires in the connecting regions 58, 60, 61 and 63 to terminals remote from the vibrator. Similarly, another three-terminal configuration can be provided by commonly grounding terminals 58, 60 and 62, and providing an electrode terminal from connecting region 59, the other electrode being formed by coupling terminals 61 and 63. Also, a three-output filter can be constructed by grounding connecting terminals 59 and 62, and providing a driving terminal including connecting terminal 58 and output terminals including connecting terminals 60, 61 and 63, respectively. Of course other combinations of couplings to produce two output and three output filters are possible and one is not limited by this discussion. Finally, two separate and distinct thin-film electrodes 43 are disposed on the top surface of the vibrator of FIGS. 13a and b, the removal of same changing the mass of the vibrator to allow for tuning thereof as is further discussed with respect to FIGS. 15a and 15b.

Figure 15A:
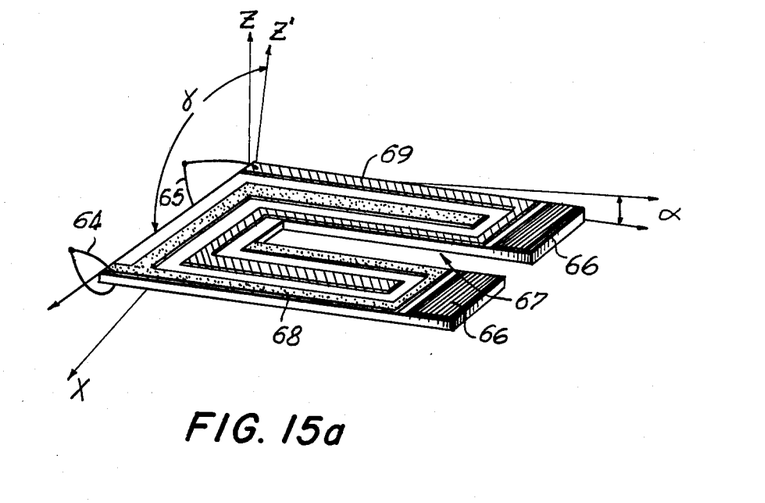
Figure 15B:
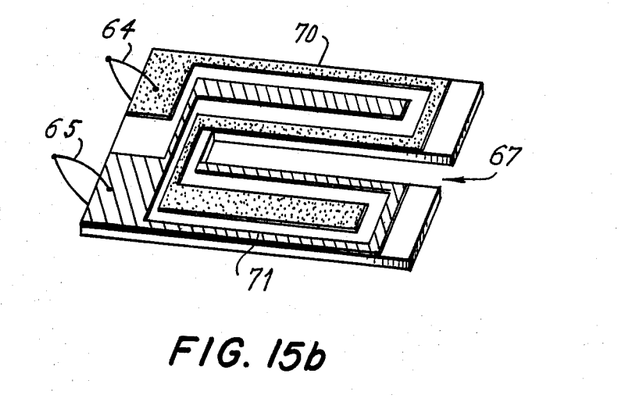
Figure 16:
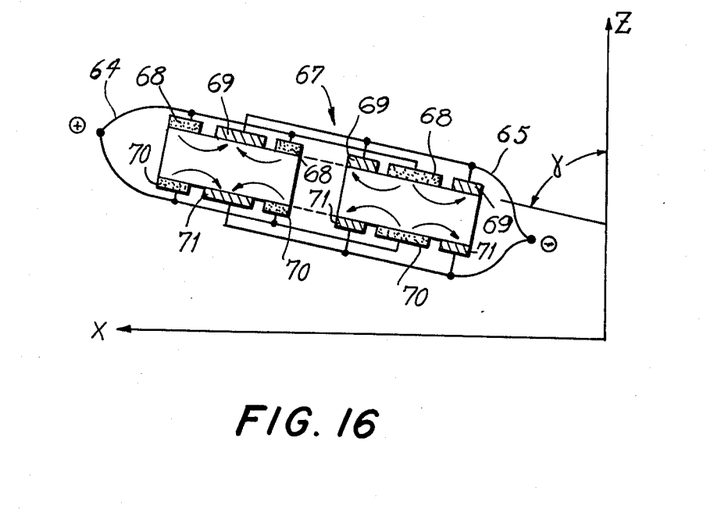
FIG. 16 is a sectional view of the quartz crystal vibrators depicted in FIGS. 15a and 15b.

Reference is now made to FIGS. 15a, 15b and 16, wherein a two-terminal electrode configuration is depicted. Tuning fork quartz crystal vibrator 67 is formed with electrodes 68 and 69 on the top surface thereof and electrodes 70 and 71 on the bottom surface thereof. Connecting wires 64 and 65 are provided for connecting electrodes 68 and 70 and 69 and 71, respectively, so that the vibrator is connected in a two-terminal mode. Two separate and distinct metallic thin-film electrodes 66 are disposed on the top surface of the tines to allow the resonant frequency of the tuning fork vibrator to be controlled by irradiating the thin film with a laser beam to evaporate the thin film to thereby change the mass of each tine. Although the thin film electrodes 26 are shown to be separate and distinct from the other electrodes 68 and 69, they can be coupled to said other electrodes without affecting the operation of the vibrator. The quartz crystal plate is formed in the same manner as noted for the above embodiments, and the transverse components of the stress fields in the X-axis direction are considerably larger than the embodiments depicted in FIGS. 9 and 11, thereby even further reducing the dynamic impedance thereof.

Figure 17:
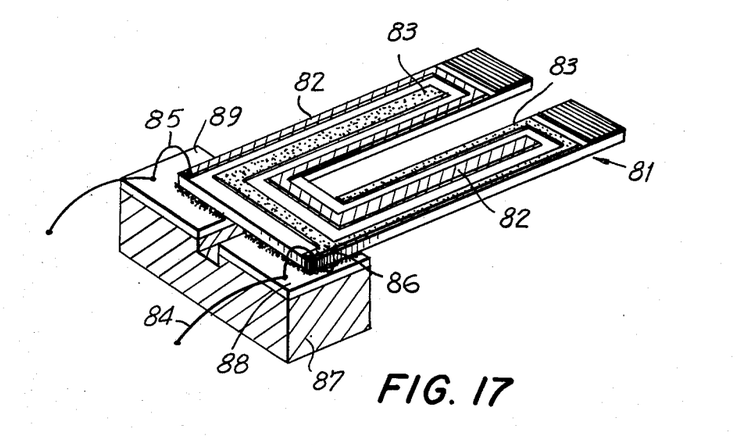
FIG. 17 is a perspective view of a mounting for a flexural mode quartz crystal vibrator constructed in accordance with the instant invention.
Figure 18:
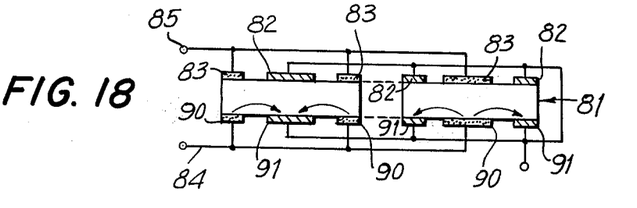
FIG. 18 is a sectional view of the flexural mode quartz crystal vibrator depicted in FIG. 17 in a three terminal connection.

Referring to FIGS. 17 and 18, the same two-terminal tuning fork illustrated in FIGS. 15a and 15b is illustrated with a novel mounting support member 87 for providing an improved electrical coupling thereto. A nonconductive U-shaped support 87 formed of ceramics or the like supports the vibrator at a nonvibratory portion thereof. Conductors 88 and 89 are deposited on the support 87 and because of the support's U-shape are isolated from each other. The vibrator 81 is supported by being securely affixed to the conductors 88 and 89 by a low-melting-point alloy, a conductive adhesive agent or the like, in such a manner that the electrodes deposited on the vibrator for securing the vibrator to the support provides an electrical coupling thereto. Therefore, the electrode 83 on the front surface is coupled to the electrode 90 on the back surface through connecting wire 84 and the conductor 88, and similarly, the other front electrode 82 on the front surface is coupled to the bottom electrode 91 through connecting wire 85 and conductors 89. Thus, a two-terminal structure is formed, wherein lead wires 84 and 85 are respectively connected to terminals remote from the vibrator. Electrodes 84 and 85 are not necessarily required to be wires, but instead may be made of a low-melting-point alloy or conductive adhesive agent. Also, the electrodes on the top and bottom surfaces can be connected by a conductor in the side surface as shown by dotted line 86. Although the electrode configuration as illustrated in FIGS. 17 and 18 depicts a two-terminal connection, a three-terminal vibrator can be easily constructed by connecting electrodes 89 and 91 as a common electrode, utilizing electrode 90 as a driving electrode, and electrode 88 as a detecting electrode.

Figure 20A:
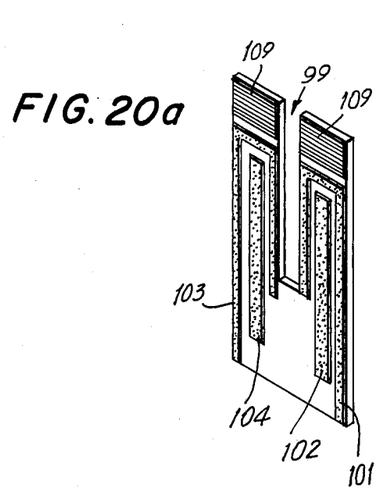
FIGS. 20a and 20b are perspective views of still another embodiment of a flexural mode quartz crystal vibrator constructed in accordance with the instant invention.
Figure 20B:
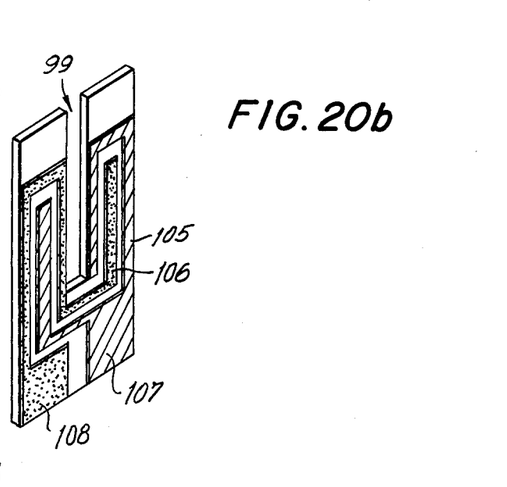
Figure 21:
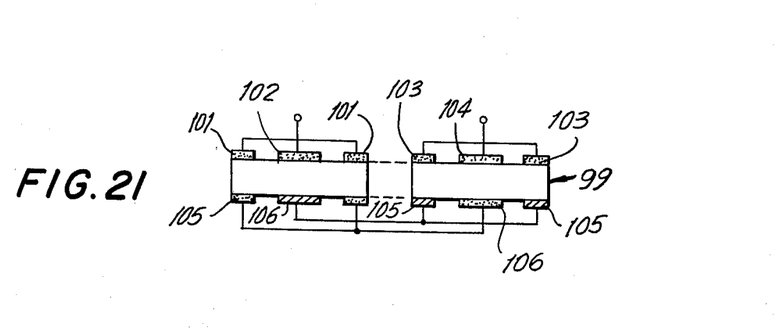
FIG. 21 is a sectional view of the flexural mode quartz crystal vibrator depicted in FIG. 20.

FIGS. 20a, 20b and 21 further illustrate another embodiment of a tuning fork flexural-mode quartz crystal vibrator 99. Electrodes 101, 102, 103 and 104 are disposed on the top surface thereof. Electrodes 105 and 106 are disposed on the bottom surface thereof and electrode portions 107 and 108 are the securing electrodes for affixing the vibrator to a support in the same manner as illustrated in FIG. 15b and FIG. 17. Control electrodes 109 are similar to the control electrodes illustrated in FIG. 15a. The electrode configuration illustrated in FIG. 20 provides a one-input and one-output filter by connecting electrodes 101 and 104 on the front surface, connecting electrodes 102 and 103 as one pair of detecting electrodes, and the pair of electrodes on the back surface 105 and 106 as one pair of driving electrodes. Also, a one-input and two-output filter can be constructed by utilizing the electrodes on the back surface 105 and 106 as one pair of driving electrodes, and the electrodes on the front surfaces 101 and 102 as one pair of detecting electrodes and electrodes 103 and 104 as the other pair of detecting electrodes.

Figure 19A:
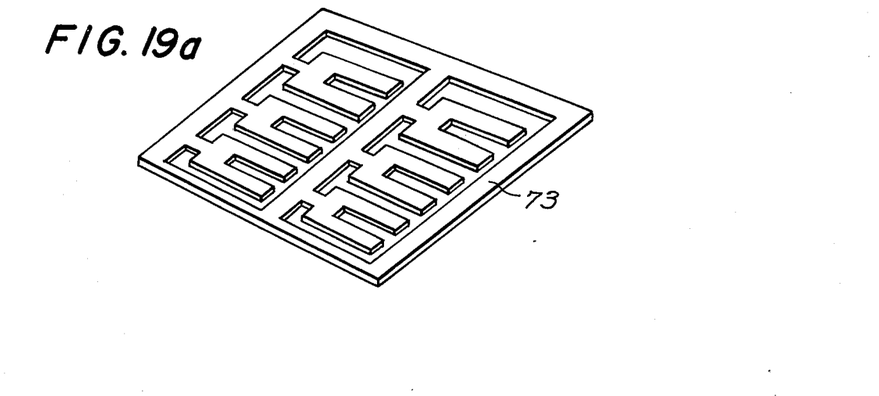
FIGS. 19a, and 19b and 19c are perspective, sectional and sectional views, respectively, of a quartz crystal plate during stages in the forming of same by a photo-etching process.
Figure 19B:
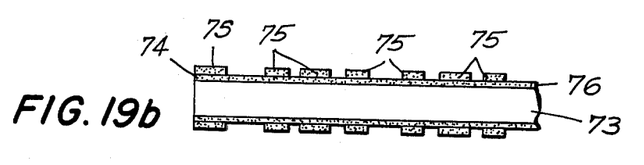
Figure 19C:
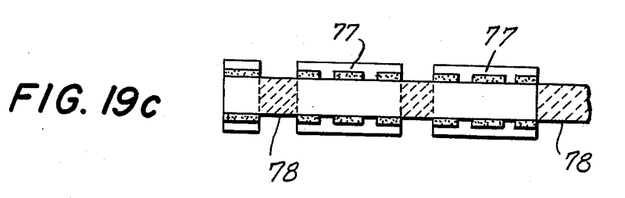

A method of producing a flexural-mode vibrator utilizing a chemical forming process is illustrated in FIGS. 19a–19c, wherein a thin quartz crystal plate 73, which is 0.5 mm or less in thickness, has its surface ground smooth like a mirror to make said plate responsive to be photo-etch into the shape of a tuning fork. As is appreciated, a plurality of quartz crystal vibrators can be simultaneously produced by this method. As illustrated in FIGS. 19b and 19c, a first step in the photo-etching chemical process is to form the shapes of the electrodes on the tuning fork in accordance with the sectional views shown in FIGS. 19b and 19c. In FIG. 19b, photo-resist 75 is maintained in the shape of an electrode by photo-etching away metallic thin films 74 deposited on front and back surfaces of the thin quartz crystal plate 73. The portions of the metallic thin film 76 not covered by the photo resist are removed by the use of an acid such as hydrochloric acid. Thus, electrodes are formed on the thin quartz crystal plate, whereupon the photo resist 77 maintains the plate in the shape of a tuning fork by photo-etching the part of the quartz crystal 78 not covered with photo resist being etched away by the use of hydrogen fluoride or the like. Accordingly, an ultra-small-sized flexural mode quartz crystal vibrator is produced by a chemical method and can be supported by utilizing the direct-adhesion structure illustrated in FIG. 17 of the instant invention.

It is noted that although the above-identified invention has been illustrated with respect to a tuning-fork-type vibrator, the improvements noted above are equally applicable to a free-free-bar flexural quartz crystal vibrator or any other type of flexural quartz crystal vibrator contemplated. Moreover, as discussed above, the instant invention provides the benefits which inure to a conventional +5° X-cut and NT-cut quartz crystal plate by providing a new way of applying the electric field to the vibrator which is characterized by the lowering of the dynamic impedance while maintaining the flexion-point temperature near normal operating temperatures. Furthermore, because the instant invention eliminates the need for electrodes on the side surfaces of the vibrator plate, not only can a chemical producing method be utilized to construct the instant invention, but the resulting quartz crystal vibrator has a diminished thickness to render same particularly suitable in an electronic timepiece. Moreover, by the forming process hereinabove discussed, the vibrator can be supported by a direct adhesion to a support member, thus rendering such a vibrator suitable for mass production, the same vibrator being particularly adapted to have a two-terminal, three-terminal or a filter configuration by changing the couplings of the electrodes.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A flexural-mode quartz crystal vibrator comprising an X-cut quartz crystal plate having a vibratory portion defined by first and second opposed substantially planar surfaces, a plurality of electrodes disposed on at least one of said surfaces, circuit means coupled to said electrodes for applying signals to said vibrator electrodes to generate electric fields between said electrodes, said electrodes being disposed to direct the major component of said fields substantially parallel to said surfaces in said crystal plate and define a vibrational direction of said vibratory portion parallel with said opposed planar surfaces, said plate having a thickness between said opposed planar surfaces no greater than 0.5 mm, and said plate being formed by rotating an X-cut plate around the X-axis by 0° to 10° and further rotating the plate around the Y'-axis by 70° to 90° or −70° to −90°.

2. A flexural mode quartz crystal vibrator as claimed in claim 1, wherein said second opposed surface includes a metallic thin film on a portion thereof which is non-vibratory, said film providing a means for mounting said quartz crystal vibrator.

3. A flexural mode quartz crystal vibrator as claimed in claim 2 and including a U-shaped conductive support defining two contacting points, said film on said non-vibrating portion being mounted to said conductive support.

4. A quartz crystal vibrator as claimed in claim 1, wherein said vibrator is a tuning fork vibrator having two tines defining said vibrator portions, said first opposed planar surface of each tine having three electrodes disposed thereon, two of said electrodes being disposed on the peripheral sides of said surface of the tines, and the third electrode being disposed intermediate and not in contact with said two peripherally disposed electrodes.

5. A quartz crystal vibrator as claimed in claim 4, wherein the second planar surface includes a metallic thin film on a portion thereof which is non-vibratory, said film providing mounting means for said quartz crystal vibrator.

6. A flexural mode quartz crystal vibrator as claimed in claim 1, said plate including a vibratory portion defined by first and second opposed substantially planar surfaces, each planar surface having disposed thereon at least a pair of electrodes, said planar surfaces being parallel to the vibratory plane of said vibrator, each said pair of electrodes having applied thereto an a.c. voltage to effect said vibration.

7. A flexural mode quartz crystal vibrator as claimed in claim 6, wherein said plate electrodes are photo-etched on the surface thereof.

8. A flexural mode quartz crystal vibrator as claimed in claim 6, wherein both said plurality of electrodes includes pairs of electrodes on each of said planar surfaces, said electrodes having been photo-etched on said crystal plate surfaces.

9. A flexural mode quartz crystal vibrator as claimed in claim 6, and including a conductive support for supporting a non-vibratory portion of said plate, said support being U-shaped to define two contacting points.

10. A quartz crystal vibrator as claimed in claim 5, wherein said first surface of each tine has thin film electrodes disposed on said surface at the end of said tines, the removal of a portion of said electrodes effecting a change in mass of said tuning fork vibrator to allow the oscillation thereof to be adjusted.

11. A quartz crystal vibrator comprising an X-cut quartz crystal plate defining a tuning fork vibrator having two vibrator tines including first and second opposed substantially planar surfaces, said first surface of each tine having three electrodes disposed thereon, two of said electrodes being disposed on the peripheral sides of said first surfaces of said tines, and the third electrodes being disposed intermediate and not in contact with said two peripherally disposed electrodes, each said intermediate electrode being short circuited to the peripheral electrodes on the other tine.

12. A quartz crystal vibrator as claimed in claim 11, wherein the other planar surface carries a metallic thin film on a portion thereof which is non-vibratory, said film providing a mounting means for mounting said quartz crystal vibrator.

13. A quartz crystal vibrator as claimed in claim 11, wherein the second planar surface has the same electrode configuration as said first surface.

14. A quartz crystal vibrator as claimed in claim 11, wherein said opposed surfaces of said tuning fork vibrators include a yoke portion common to both said tines, said yoke portion including two further electrodes disposed on said first surface said electrodes in non-contacting relationship with each other, each further electrode connecting an electrode on the peripheral side of one tine to the intermediate electrode on the other tine to cause said short circuiting.

15. A quartz crystal vibrator as claimed in claim 14, wherein the second planar surface has substantially the same electrode configuration as said first surface.

16. A quartz crystal vibrator as claimed in claim 14, wherein the second planar surface includes a metallic thin film on a portion thereof which is non-vibratory, said film providing mounting means for said quartz crystal vibrator.

17. A quartz crystal vibrator as claimed in claim 14, wherein said electrodes on said first surface at the end of said tines is adapted to be removed so as to allow the mass thereof to be changed to effect a tuning of the vibrator.

18. A quartz vibrator as claimed in claim 16, wherein said thin film is divided in at least two portions, each portion forming a part of one of said further electrodes to provide electrical connection thereto.

19. A quartz crystal vibrator as claimed in claim 18 and including a U-shaped conductive support to define two contacting points, said thin film being divided into only two portions, said thin film portions being respectively mounted to said contacting points to define a two terminal connection of said second electrodes to said conductive support.

20. A flexural mode quartz crystal vibrator comprising a quartz crystal plate having a vibratory portion defined by first and second opposed planar surfaces, the thickness of said plate between said opposed surfaces being no greater than 0.5 mm, said plate being formed by rotating an X-cut plate around the X-axis by 0° to 10° and further rotating said plate around the Y'-axis by 70° to 90° or −70° to −90°, a first opposed planar surface defining said vibratory portion having three electrodes disposed thereon to define a plane of vibration parallel to said first opposed surface, two of the electrodes being disposed on the peripheral sides of said first opposed surface and the third electrode being disposed intermediate and not in contact with said two peripheral electrodes.

21. A flexural mode quartz cyrstal vibrator as claimed in claim 20, wherein both said peripherally disposed electrodes are electrically coupled together.

22. A flexural mode quartz crystal vibrator as claimed in claim 20, wherein said vibrator is a tuning fork vibrator having two tines, each said tine being formed by first and second opposed planar surfaces for defining a vibratory portion, a first opposed planar surface of each said tine having three electrodes disposed thereon to define planes of vibration of each tine parallel to said first opposed surface.

23. A flexural mode quartz crystal vibrator as claimed in claim 22, wherein each said intermediate electrode disposed on the respective tines is short circuited to the peripheral electrodes disposed on the other tine.

24. A flexural mode quartz crystal vibrator as claimed in claim 23, wherein said plate electrodes are photo-etched on the surface thereof.

25. A flexural mode quartz crystal vibrator as claimed in claim 23, wherein said second opposed planar surface includes a metallic thin film on a portion thereof which is non-vibratory, said film providing a means for mounting said tuning fork vibrator.

26. A flexural mode quartz crystal vibrator as claimed in claim 23, wherein portions of said electrodes on said first opposed surface at the end of said tines are adapted to be removed so as to allow the mass thereof to be changed to effect tuning of the vibrator.

* * * * *